United States Patent
Joly

(10) Patent No.: US 7,153,747 B2
(45) Date of Patent: Dec. 26, 2006

(54) METHOD FOR MAKING A TRANSISTOR ON A SIGE/SOI SUBSTRATE

(75) Inventor: Jean-Pierre Joly, Saint Egreve (FR)

(73) Assignee: Commissariat A L'Energie Atomique, Paris (FR)

( * ) Notice: Subject to any disclaimer, the term of this patent is extended or adjusted under 35 U.S.C. 154(b) by 5 days.

(21) Appl. No.: 10/484,056

(22) PCT Filed: Jul. 16, 2002

(86) PCT No.: PCT/FR02/02523

§ 371 (c)(1),
(2), (4) Date: Jan. 16, 2004

(87) PCT Pub. No.: WO03/009404

PCT Pub. Date: Jan. 30, 2003

(65) Prior Publication Data

US 2004/0180521 A1      Sep. 16, 2004

(30) Foreign Application Priority Data

Jul. 19, 2001      (FR) ................... 01 09665

(51) Int. Cl.
*H01L 21/336* (2006.01)
(52) U.S. Cl. ....................... 438/300; 438/585
(58) Field of Classification Search ........ 438/300, 438/585
See application file for complete search history.

(56) References Cited

U.S. PATENT DOCUMENTS

| | | | |
|---|---|---|---|
| 4,660,062 A | 4/1987 | Nishizawa et al. | 357/23.3 |
| 5,677,210 A | 10/1997 | Park et al. | 437/40 |
| 5,846,862 A | 12/1998 | May et al. | 438/270 |
| 6,051,473 A * | 4/2000 | Ishida et al. | 438/300 |
| 6,054,355 A | 4/2000 | Inumiya et al. | 438/296 |
| 6,391,799 B1 | 5/2002 | Di Cioccio | 438/781 |
| 6,495,402 B1 * | 12/2002 | Yu et al. | 438/149 |
| 2001/0030350 A1 * | 10/2001 | Oowaki et al. | 257/410 |

FOREIGN PATENT DOCUMENTS

| | | |
|---|---|---|
| DE | 44 47 149 A1 | 12/1994 |
| FR | 98 00899 | 1/1998 |

OTHER PUBLICATIONS

D.J., Godbey, A.H. Krist, K.D. Hobart, and M.E. Twigg, Selective Removal of Si 1-x Gex from (100) Si Using HNO3 and HK.
Hobart, K D., "Perspectives on Wafer Bonding Technology for Thin Film Devices", Naval Research Laboratory, Washington, DC, pp. 63-64.

* cited by examiner

*Primary Examiner*—Thanh Nguyen
(74) *Attorney, Agent, or Firm*—Thelen Reid & Priest LLP

(57) ABSTRACT

A process for producing a MOS-type transistor includes providing a substrate comprising a thin layer of silicon (26), integral with an insulating support (14), and covered with a superficial layer (28) of a semi-conductor material, local etching of the superficial layer to expose the silicon layer in at least one channel region, formation of an insulated gate (50) above the silicon layer in the channel region, and formation of a source and a drain on either side of the channel region, the source and drain extending in the layer of silicon and in the superficial layer.

16 Claims, 2 Drawing Sheets

METHOD FOR MAKING A TRANSISTOR ON A SIGE/SOI SUBSTRATE

CROSS-REFERENCE TO RELATED APPLICATION

This application claims priority based on International Patent Application No. PCT/FR02/02523, entitled "Transistor and Process for Producing a Transistor on a SIGE/SOI Substrate" by Jean-Pierre Joly, which claims priority of French application no. 01 09665, filed on Jul. 19, 2001, and which was not published in English.

TECHNICAL FIELD

The present invention relates to a field effect transistor of MOS type (transistor with insulated gate) and a process for producing said transistor.

The invention can be applied in general in the fields of microelectronics and commutation electronics. It is aimed in particular at the production of transistors capable of functioning at high frequencies.

PRIOR ART

Rapid-switching Transistors, that is, transistors capable of functioning at high frequency, generally have short and sufficiently fine channels to authorize their full depletion. Also, in producing them, use is preferably made of substrates of silicon-on-insulator type (SOI). A particular feature of these substrates is a thin layer of silicon, separated from a solid substrate by an embedded insulating layer of, for example, silicon oxide. The channel of the transistor, as well as the source and the drain, are then formed in the thin layer.

A technique well-known for manufacturing substrates of silicon-on-insulator type consists of transferring to a receiver substrate, comprising a superficial layer of silicon oxide, a block of donor silicon, and fracturing this block along an embrittlement zone to detach a thin layer from it. The thin silicon layer remains integral with the layer of silicon oxide, which is thus embedded. Even though other solutions can be offered, the embrittlement zone of the block of silicon is preferably made by implanting hydrogen and/or rare gas ions. Therefore, the thickness of the thin layer is dictated by the depth, therefore the implantation energy, of the embrittlement zone. Now, it eventuates that this technique does not produce layers of silicon whereof the thickness does not exceed a few nanometers and which may be controlled with a good precision. Indeed after the transfer, the silicon layer has some roughness, or at least some surface defects.

In order to guarantee a better precision of the thickness of the silicon layer, as well as a good surface quality, another technique consists of having the silicon layer grow by epitaxy on a layer of a material such as SiGe, before it is transferred from a donor substrate to the receiver substrate. The transfer takes place by leaving the thin silicon layer integral with all or part of the layer of SiGe, and possibly a part of the donor substrate. In other words, the embrittlement zone is not formed in the silicon, but in the underlying layer of SiGe or substrate. Following transfer the remainder of the layer of SiGe, as well as possibly the remainder of the donor substrate, are taken off by etching. This etching procedure is carried out using selective etching agents relative to the silicon so as to be able to utilize the thin silicon layer as an etching stop layer.

In the end of etching, the thin silicon layer which is integral with the layer of oxide of the receiver substrate has a completely free face. Accordingly, the thickness of the layer is not dictated by the fracture of a donor substrate, but by epitaxy. Now, epitaxy produces particularly thin layers and permits their thickness to be perfectly controlled.

The thinness of the silicon layer also allows the length of the channel to be reduced and thus allows the transistor to be miniaturized. In addition, a very thin layer of silicon can result in 'bi-dimensional' transistors with very strong depletion of the channel. The frequency performances of the transistors are thus improved. On the other hand and still because of the low thickness of the silicon layer the access resistance to the source and drain tends to increase and constitutes a new limit of the performances of the transistors.

An illustration of the prior art can be found, for example, in the documents (1) and (2), of which the references are specified in the end of the present description.

DESCRIPTION OF THE INVENTION

The object of the invention is to propose a transistor and its production process, which does not have the difficulties or limitations mentioned hereinabove.

An aim in particular is to propose a process, which controls the thickness and the length of the channel with high precision.

Another aim still is to propose a transistor with reduced access resistances to the source and the drain.

To attain these aims, the object of the invention more precisely is a process comprising the following stages:
a) providing a substrate comprising a thin layer of silicon, integral with an insulating support, and covered with a superficial layer of a semi-conductor material,
b) locally etching the superficial layer to expose the silicon layer in at least one channel region,
c) forming an insulated gate above the silicon layer in the channel region, and forming a source and a drain on either side of the channel region, the source and drain extending in the layer of silicon and in the superficial layer.

In this process the so-called superficial layer is preferably a layer having a unit cell parameter close to that of silicon. It has several functions. A first function is to authorize selective etching relative to the silicon. A second function is to increase the volume of the source and the drain, by raising them, so as to reduce their access resistance. Finally, whenever it has a unit cell parameter close to that of silicon, a third function is to favor epitaxial growth of a thin silicon layer, with a controlled thickness.

The superficial layer is preferably a layer of SiGe. However, other semi-conductor materials such as, for example, SiC or alloys of $Si_xGe_yC_{1-x-y}$, $Ga_xP_{1-x}$ or $Ga_xIn_{1-x}N_yAs_{1-y}$ type can also be appropriate.

The local etching of the superficial layer comes down to making a well in this layer at the place where the future gate will be formed. It should be noted that, even though the description essentially refers to the manufacture of a single transistor, a plurality of transistors can be produced concomitantly. In this case, etching is done according to a pattern allowing exposure of the thin layer in a plurality of channel regions, each of these regions then being provided with a gate, and linked to the source and the drain.

The etching of the superficial layer is preferably a dry anisotropic etching. However, when the silicon layer is particularly thin, or when any alteration thereto is to be avoided, it is possible to carry out a first dry anisotropic etching, and second wet etching, with the dry etching being interrupted before complete elimination of the superficial layer in the channel region. The second etching, which has a selectivity higher than that of the first etching, is continued and stopped on the silicon layer.

In effect, wet etchings generally have better selectivity than dry etchings, but are often isotropic.

The source and drain are formed not only in the thin layer of silicon, but also in overlying regions of the superficial layer, on both sides of the channel. Even though other techniques, such as diffusion, can be used, the regions of source and drain are preferably formed by implantation of doping impurities. The implantation can followed by thermal activation treatment.

To obtain a perfect alignment of the source and drain with the gate, the latter can be formed before the source and drain, and made use of as an implantation mask. In this case however, the gate is capable of being subjected to the activation treatment. A selection of refractory materials for the gate effectively avoids this constraint. When it has to undergo thermal treatment, the gate can be made, for example, of polycrystalline silicon, or of a more fragile material, such as copper, but protected by a refractory material.

According to an improvement, producing the gate can also comprise the following stages:

formation of a bogus gate on the layer of silicon in the channel region, implantation of doping impurities in the layer of silicon and the superficial layer, by using the bogus gate as an implantation mask, and replacement of the bogus gate by a definitive gate, insulated by a gate dielectric layer.

As the gates are always formed in the well obtained by etching above the channel region, the source and drain preserve their alignment properties during replacement of the bogus gate by the definitive gate. In addition, the materials of the bogus gate and of the definitive gate can be selected more freely as a function of possible production constraints. For example, the bogus gate can be made of a material capable of fully resisting the thermal constraints of a possible activation treatment of doping impurities. Moreover, the material of the definitive gate, free of any thermal constraint, can be selected, for example, as a function of its work function in view of a low threshold voltage of the transistor.

According to a particular embodiment of the invention, deposit of the gate material, and especially deposit of the material of the definitive gate, can be followed by one or several planarazing procedures with stop on, or in, the so-called superficial layer. Planarizing produces a flush damascene gate.

Stage a) of the process essentially comprises providing a substrate for producing the transistor. It can comprise, for example:

formation, on a first substrate, of the superficial layer made of a material having a unit cell parameter close to silicon, formation, by epitaxy, of a thin layer of silicon on the so-called superficial layer, and transfer of the thin silicon layer and at least a part of the superficial layer on an insulating support, by making the thin layer of silicon integral with said insulating support.

The insulating support can be a bulk support, such as a block of glass or sapphire, but can also be a simple insulating layer integral with a substrate which is not necessarily so. For example, it can be a layer of silicon oxide covering a block of bulk silicon.

The invention finally relates to a field-effect transistor comprising:

a channel formed in a thin layer of monocrystalline silicon, regions of source and drain, extending on both sides of the channel in the silicon layer and in a superficial semiconductor layer covering the layer of silicon, the semiconductor layer having a unit cell parameter close to silicon, and an insulated gate, disposed above the channel, the gate being flush so as to brush the superficial layer.

Other characteristics and advantages of the invention will emerge from the following description, with reference to the figures of the attached drawings.

This description is given purely by way of illustration and non-limiting.

DETAILED DESCRIPTION OF EMBODIMENTS OF THE INVENTION

Figure 1:
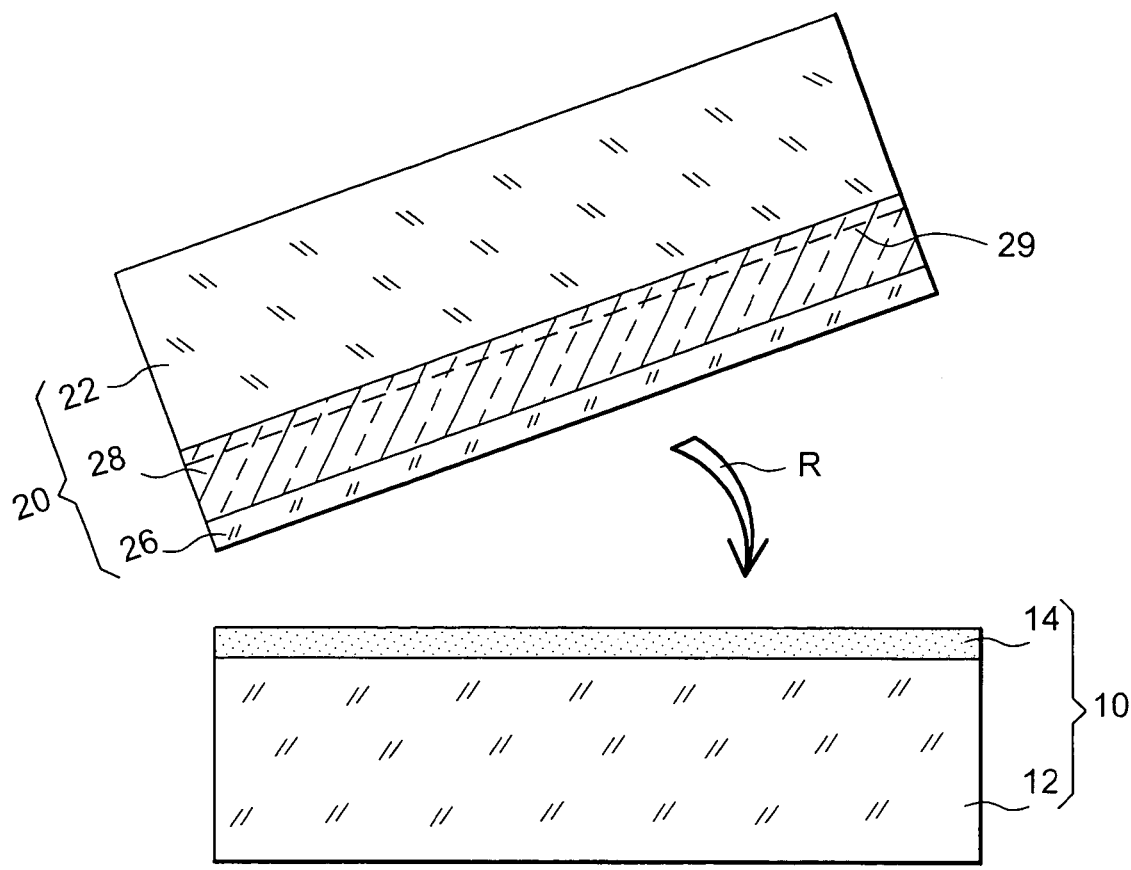
FIG. 1, illustrates, in the form of schematic sections, donor and receiver substrates, for producing a substrate suitable for implementing a process according to the present invention.

In the following description, identical, similar or equivalent components of the different figures are marked by the same reference numerals to facilitate the transfer between the figures. In addition, and in the interests of clarifying the figures, all the elements are not represented according to a uniform scale.

FIG. 1 illustrates the formation of a substrate adapted to the manufacture of a transistor according to the present invention. A first receiver substrate 10 comprises a support block 12, made of bulk silicon, covered with a layer of silicon oxide 14. The layer of silicon oxide, utilized for its electrical insulation properties, constitutes the 'insulating support', which is still alluded to. By way of variant, the support block covered by an insulating layer can be replaced by a block of bulk insulating material.

A second substrate, designated by donor substrate, likewise comprises a support block 20, and on this block, a layer of SiGe 28, and a thin layer of silicon 26, preferably monocrystalline. The thin layer of silicon 26 is formed by epitaxy on the layer of SiGe, so as to precisely control its thickness. The latter is, for example between 1 and 20 nm.

In the example illustrated by the figures, and described here, the SiGe is selected especially for its property for having a unit cell parameter, which is sufficiently close to silicon to allow growth of a crystalline layer of good quality, and for its property of being able to be etched selectively relative to silicon.

Reference 29 designates an embrittlement zone formed in the layer of SiGe. It is formed, for example, by ionic implantation.

An arrow R indicates the transfer of the donor substrate 20 onto the receiver substrate 10. The transfer comprises fixing the thin layer 26 against the layer of silicon oxide 14. The latter acts as insulating support. The fixing can take place with or without intermediary material; for example this can be a bonding by direct molecular adhesion.

The transfer of the donor substrate onto the receiver substrate is followed by fracture of the donor substrate, along the embrittlement zone 29. The effect of the fracture is to detach the thin silicon layer, from now on integral with the receiver substrate, and all or part of the layer 28 of SiGe covering the layer of silicon. In this respect, the layer of SiGe is still designated by 'superficial layer'. The embrittlement zone 29 can optionally be formed outside the layer of SiGe, for example, in the support block 22. However, it is important to note that the embrittlement zone does not delimit the thin silicon layer, taken separately. Thus, during its transfer to the receiver substrate the thin layer of silicon 26 is in no way modified.

Figure 2:
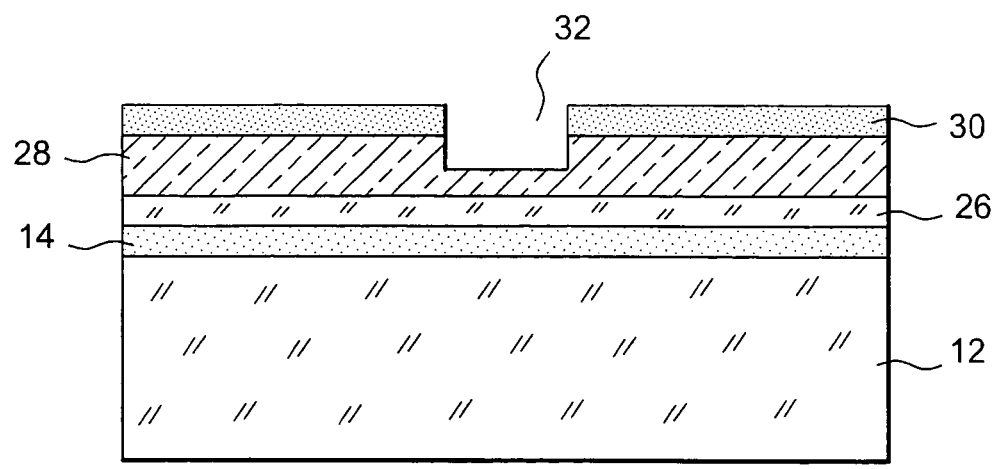
FIGS. 2 and 3 are diagrammatic sections of a substrate obtained following the process stage corresponding to FIG. 1, and illustrate an etching stage for defining a channel region of a transistor.

As shown in FIG. 2, after fracture and elimination of the remaining part of the donor substrate, an etching mask 30 is formed on the free face of the superficial layer 28. This is a resin mask. The mask 30 exhibits an opening 32 corresponding to emplacement of the channel of a transistor, which is to be formed on the substrate. Although the figures are limited to the realization of a single transistor, a plurality of transistors can be formed on the same substrate. In this case, the layer of etching mask has an opening corresponding to the channel of each transistor to be produced.

The superficial layer 28 is subjected to a first anisotropic etching, through the opening 32 of the mask layer. This is a dry etching. In this particular example an atmosphere of active gas CF4 at 10 sccm, mixed with nitrogen at 200 sccm, at a pressure of 1 Torr is used. At least one of the parameters of the dry etching, for example its duration, is selected to interrupt the etching of the superficial layer 28 of SiGe before the underlying thin layer of silicon 26 is reached.

The first etching is followed by a second wet, isotropic etching. The utilized etching agents are selected so as to selectively eliminate the SiGe relative to the silicon. Still by way of example a mixture of $HNO_3$, $H_2O$ and HF can be used which, according to the concentration of germanium of the superficial layer, yields selectivities of the order of 100. This subject can be referred to in document (3) whereof the references are specified at the end of the description. The very good selectivity of the second wet etching helps to perfectly conserve the thickness and the surface quality of the thin silicon layer 26.

Figure 3:
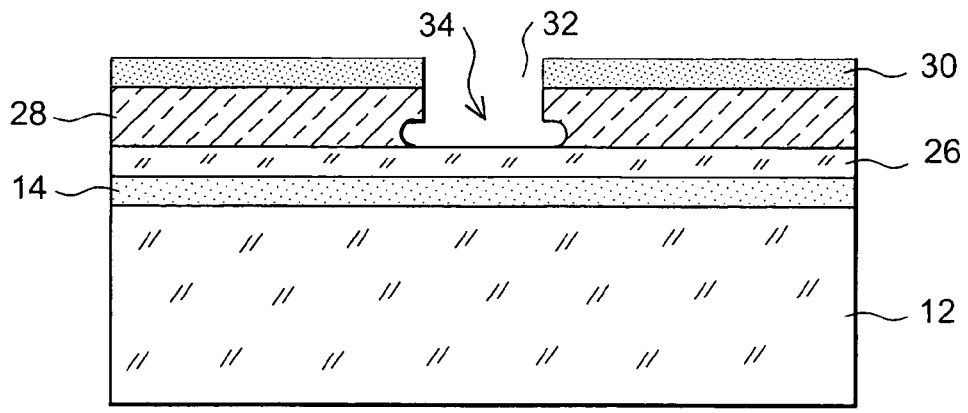

As shown in FIG. 3, the second etching is followed up with stop on the thin layer of silicon 26. The latter is exposed at the bottom of a well 34 of which the lateral sides are adjusted on the opening 32 of the etching mask. More precisely, the upper part of the sides is aligned vertically to the opening 32, while the lower part, in the vicinity of the thin layer, exhibits a slight splaying. This splaying is due to the isotopic character of the second etching.

The splaying can be avoided by performing one or several exclusively anisotropic etchings. However, the anisotropic etchings have a lesser selectivity, and therefore must be controlled with greater care to preserve the layer of silicon 26.

Figure 4:
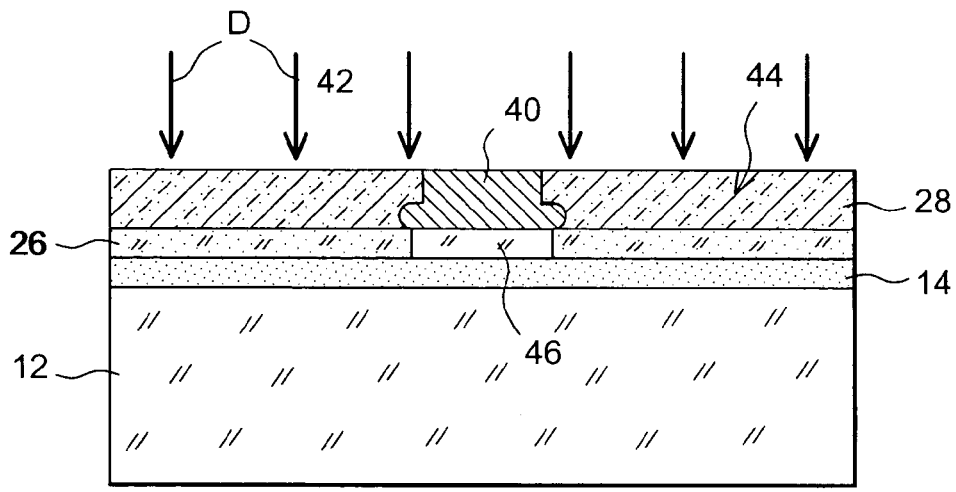
FIG. 4 is a diagrammatic section of the substrate obtained following the process stage corresponding to FIG. 3, and illustrates production of a source and a drain of the transistor.

FIG. 4 shows the realization of the source and drain.

At first, a bogus gate 40, for example made of a material such as silicon nitride, is formed in the previously etched well. The bogus gate is flush and brushes the surface of the superficial layer 28.

This can be attained by depositing the material of the gate on the entire surface of the substrate, with adequate thickness to fill up the well, then by planarizing, for example mechano-chemical polishing, with stop on or in the superficial layer 28.

The substrate is then subjected to an implantation D of doping impurities using the bogus gate as implantation mask. Implantation takes place in the thin layer of silicon 26 and in the superficial layer of SiGe 28. It extends on both sides of the bogus gate to form a source 42 and a drain 44. The bogus gate protects an underlying portion of the thin layer making up the channel 46 of the transistor. The source and drain are thus self-aligned on the bogus gate 40 and thus on the channel 46.

An implantation mask, not illustrated, can optionally be provided to limit the extension of the source and drain or to define their form outside the transistor.

The implantation of the doping impurities is followed by thermal activation treatment. Thermal treatment also allows the doping impurities to be diffused and the electric resistance of the source and drain to be minimized, especially at the Si/SiGe interface.

Figure 5:
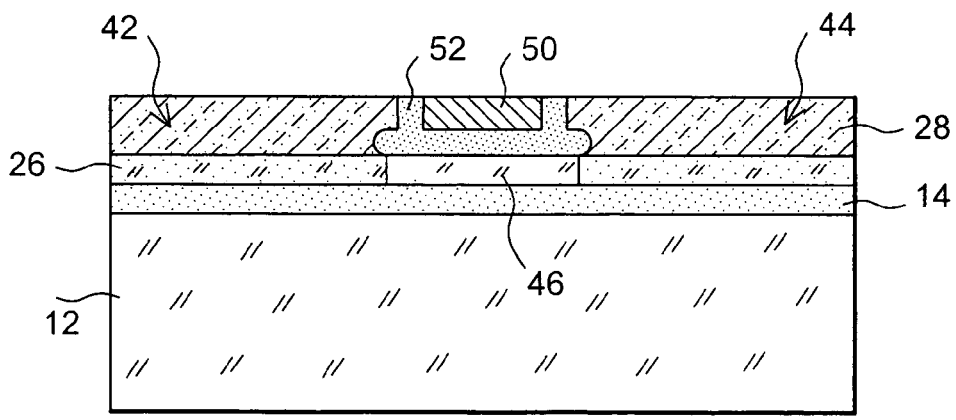
FIG. 5 is a diagrammatic section of the substrate obtained following the process stage corresponding to FIG. 4, and illustrates production of a source and a drain of the transistor.

FIG. 5 shows replacement of the bogus gate 40 by a definitive gate 50. The bogus grille is eliminated, via selective etching, to re-open the well. This operation is followed by formation of an insulating layer of gate 52, then of a gate 50.

The insulating layer of gate 52, formed by deposit or by oxidation, carpets the walls of the well so as to insulate the gate from the channel 46, but also from the source and drain 42, 44. As for the bogus gate, the formation of the definitive gate comprises the deposit of a material followed by planarization. The definitive gate is thus flush and likewise brushes the surface of the superficial layer 28. As the definitive gate occupies the location of the bogus gate, the source and drain remain self-aligned on the definitive gate. In addition, the definitive gate, in this embodiment example, does not undergo thermal treatment. It is made, for example, of copper or W or a TiN/Cu bi-layer.

According to a variant, the definitive gate can also be formed directly and this gate can be used as an implantation mask of the source and drain. Then use of a bogus gate is not useful. In this case, and when the implanted regions are to be subjected to thermal treatment, the gate is preferably made of a refractory conductive material such as polycrystalline silicon or a silicide, for example tungsten silicide.

Cited Documents (1) FR-A-2 774 214
(2) K. D. Hobart, Conference abstract NATO Advanced Research Workshop, 'Progress in SOI structures and device operating at extreme conditions', pp. 63–64.
(3) J. Electrochem. Soc. Vol. 139, n ° 10, Oct. 1992, "Selective removal of $Si_{1-x}Ge_x$, from (100) si using $HNO_3$ and HF", D. J. Godbey, A. H. Krist, K. D. Hobart, and M. E. Twigg.

The invention claimed is:

1. A process for producing a transistor of MOS type, comprising the following stages:

a) providing a substrate comprising a thin layer of silicon (26), integral with an insulating support (14), and covered with a superficial layer (28) of a semi-conductor material, wherein said providing a substrate further includes, forming, on a first substrate, the superficial layer (28) made of a material having a unit cell parameter close to silicon, forming, by epitaxy, a thin layer of silicon (26) on the superficial layer, and transferring the thin silicon layer and at least one part of the superficial layer on the insulating support (14), by making the thin layer of silicon (26) integral with said insulating support (14), b) local etching of the superficial layer (28) to expose the silicon layer in at least one channel region, c) formation of an insulated gate (50) above the silicon layer (26) in the channel region, and formation of a source and a drain (42, 44) on either side of the channel region, the source and drain extending in the layer of silicon and in the superficial layer.

2. The process as claimed in claim 1, wherein the superficial layer (28) has a unit cell parameter close to silicon.

3. The process as claimed in claim 1, wherein stage c) comprises:

formation of a bogus gate (40) on the layer of silicon in the channel region, implantation of doping impurities (D) in the layer of silicon and the superficial layer, by using the bogus gate as an implantation mask, and replacement of the bogus gate (50) by a definitive gate, insulated by a gate dielectric layer (52).

4. The process as claimed in claim 3, wherein the definitive gate (50) is formed by depositing a gate material on a gate dielectric layer, then by planarizing the gate material until the gate brushes the superficial layer (28).

5. The process as claimed in claim 1, wherein stage c) comprises:

production of a definitive gate (50), made of a refractory material, and implantation of doping impurities, by using the definitive gate as an implantation mask to form the regions of source and drain.

6. The process as claimed in claim 1, wherein the transfer comprises the fracture of one of the superficial layer and of the first substrate.

7. The process as claimed in claim 1, wherein the material of the superficial layer is SiGe or SiGeC.

8. The process as claimed in claim 1, wherein stage b) comprises a first dry, anisotropic etching, and a second wet etching, the dry etching being interrupted before complete elimination of the superficial layer (28) in the channel region, and the second etching having a selectivity greater than the selectivity of the first etching and being followed up with a stop on the silicon layer (26).

9. A process for producing a transistor of MOS type, comprising the following stages:

a) providing a substrate comprising a thin layer of silicon (26), integral with an insulating support (14), and covered with a superficial layer (28) of a semi-conductor material, b) local etching of the superficial layer (28) to expose the silicon layer in at least one channel region, wherein said local etching of the superficial layer (28) further includes a first dry, anisotropic etching, and a second wet etching, the dry etching being interrupted before complete elimination of the superficial layer (28) in the channel region, and the second etching having a selectivity greater than the selectivity of the first etching and being followed up with a stop on the silicon layer (26), c) formation of an insulated gate (50) above the silicon layer (26) in the channel region, and formation of a source and a drain (42, 44) on either side of the channel region, the source and drain extending in the layer of silicon and in the superficial layer.

10. The process as claimed in claim 9, wherein the superficial layer (28) has a unit cell parameter close to silicon.

11. The process as claimed in claim 9, wherein stage c) comprises:

formation of a bogus gate (40) on the layer of silicon in the channel region, implantation of doping impurities (D) in the layer of silicon and the superficial layer, by using the bogus gate as an implantation mask, and replacement of the bogus gate (50) by a definitive gate, insulated by a gate dielectric layer (52).

12. The process as claimed in claim 11, wherein the definitive gate (50) is formed by depositing a gate material on a gate dielectric layer, then by planarizing the gate material until the gate brushes the superficial layer (28).

13. The process as claimed in claim 9, wherein stage c) comprises:

production of a definitive gate (50), made of a refractory material, and implantation of doping impurities, by using the definitive gate as an implantation mask to form the regions of source and drain.

14. The process as claimed in claim 9, wherein stage a) comprises:

formation, on a first substrate, of the superficial layer (28) made of a material having a unit cell parameter close to silicon, formation, by epitaxy, of a thin layer of silicon (26) on the superficial layer, and transfer of the thin silicon layer and of at least one part of the superficial layer on the insulating support (14), by making the thin layer of silicon (26) integral with said insulating support (14).

15. The process as claimed in claim 14, wherein the transfer comprises the fracture of one of the superficial layer and of the first substrate.

16. The process as claimed in claim 9, wherein the material of the superficial layer is SiGe or SiGeC.

* * * * *